US006907592B1

(12) United States Patent
Dante

(10) Patent No.: US 6,907,592 B1
(45) Date of Patent: Jun. 14, 2005

(54) METHOD OF ROUTING IN A PROGRAMMABLE LOGIC DEVICE

(75) Inventor: Conrad Dante, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 99 days.

(21) Appl. No.: 10/255,474

(22) Filed: Sep. 25, 2002

Related U.S. Application Data

(63) Continuation-in-part of application No. 10/187,236, filed on Jun. 28, 2002.

(51) Int. Cl.⁷ .............................................. G06F 17/50
(52) U.S. Cl. .............................. 716/12; 716/1; 716/16; 716/11
(58) Field of Search ............................. 716/12, 16, 11, 716/1

(56) References Cited

U.S. PATENT DOCUMENTS

| | | | |
|---|---|---|---|
| 4,642,487 A | | 2/1987 | Carter |
| 4,706,216 A | | 11/1987 | Carter |
| 4,758,985 A | | 7/1988 | Carter |
| 5,010,477 A | * | 4/1991 | Omoda et al. .................. 712/4 |
| 5,197,065 A | * | 3/1993 | Calvignac et al. .......... 370/378 |
| 5,245,604 A | * | 9/1993 | Lacas et al. ................. 370/264 |
| 5,295,137 A | * | 3/1994 | Jurkevich ................... 370/389 |
| 5,754,459 A | | 5/1998 | Telikepalli |
| 6,023,742 A | | 2/2000 | Ebeling et al. |
| 6,262,908 B1 | | 7/2001 | Marshall et al. |
| 6,275,491 B1 | * | 8/2001 | Prasad et al. ................ 370/389 |
| 6,289,097 B1 | * | 9/2001 | Gregory et al. ............. 379/338 |
| 6,362,650 B1 | | 3/2002 | New et al. |
| 6,363,319 B1 | * | 3/2002 | Hsu ........................... 701/202 |
| 6,538,470 B1 | | 3/2003 | Langhammer et al. |
| 2002/0089348 A1 | | 7/2002 | Langhammer |

OTHER PUBLICATIONS

J.C. Alves et al., "RVC—A Reconfigurable Coprocessor for Vector Processing Applications", IEEE Com. Soc., pp. 258–259 (1998).
"Stratix: Programmable Logic Device Family," Altera Corporation, Aug. 2002, Ver. 2.1 Data Sheet.
"Silicon," Xilinx Products website, http://www.xilinx.c m/xlnx/xil__pr dc t__pr duct.jsp?title+silic n, printed Sep. 16, 2002, 3 pages.
Chameleon Systems—Your Communication Platform; from website www.chameleonsystems.com, 5 pages.
"Tool suite supports reconfigurable processor" article by Richard Goering; published in *EE Times* on Aug. 14, 2001, 6 pages.
Xilinx Home; Virtex–II Pro Platform FPGAs; The Platform for Programmable Systems; from website www.xilinx.com, 3 pages.
Xilinx Home; PowerPC Embedded Processor Solution; from website www.xilinx.com, 2 pages.
Xilinx Home; The First Platform FPGA Solution; from website www.xilinx.com, 2 pages.
Xilinx Home; Virtex–II Platform FPGA Features; from website www.xilinx.com, 3 pages.
QuickLogic Home; QuickRAM, Dual–Port Embedded RAM for Extremely High Performance Functions; from website www.quicklogic.com, 3 pages.

(Continued)

*Primary Examiner*—Matthew Smith
*Assistant Examiner*—Sun James Lin

(57) ABSTRACT

A method is disclosed to efficiently route in a programmable logic device (PLD) such as a field-programmable gate array (FPGA). The method includes identifying a source and destination pair in a circuit design; determining multiple candidate paths to route a vector between the source and destination pair; and selecting one of the candidate paths for the vector route. Efficiency may be improved by using time-division multiplexing to route multiple connections through a PLD element.

13 Claims, 12 Drawing Sheets

OTHER PUBLICATIONS

QuickLogic Home; QuickDSP, Embedded DSP Building Blocks for High-Performance, Complex DSP Designs; from website www.quicklogic.com, 2 pages.

QuickLogic Home; Eclipse, High Performance FPGAs with Enhanced Logic Supercell; from website www.quicklogic.com, 3 pages.

"Re-configurable High Speed Arithmetic Functions in a Non-Volatile FPGA", written by Rufino T. Olay III, Customer Engineer at QuickLogic, 6 pages.

High Performance Multipliers in QuickLogic FPGAs, written by John Birkner, Jim Jian and Kevin Smith of QuickLogic, 9 pages.

* cited by examiner

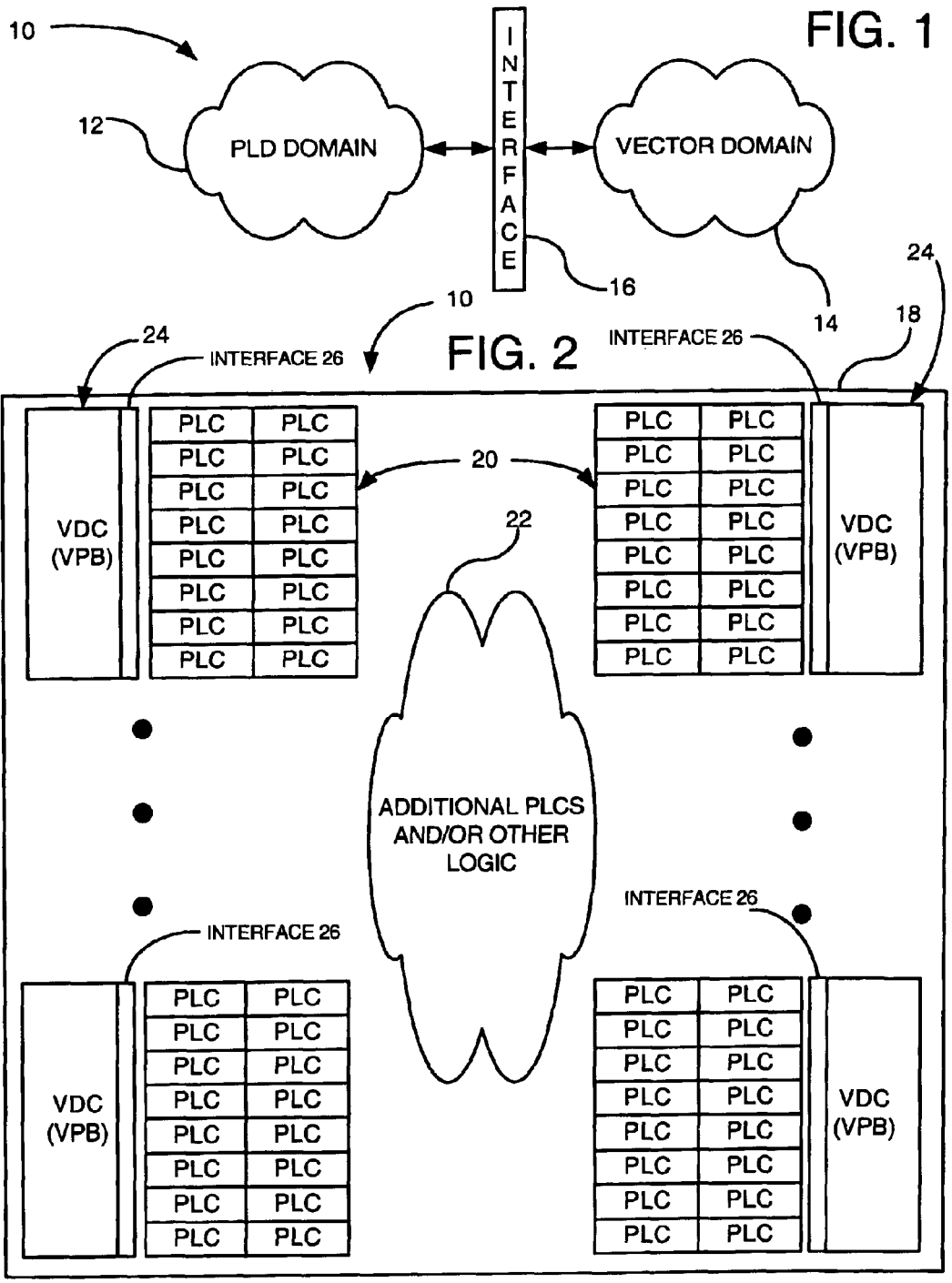

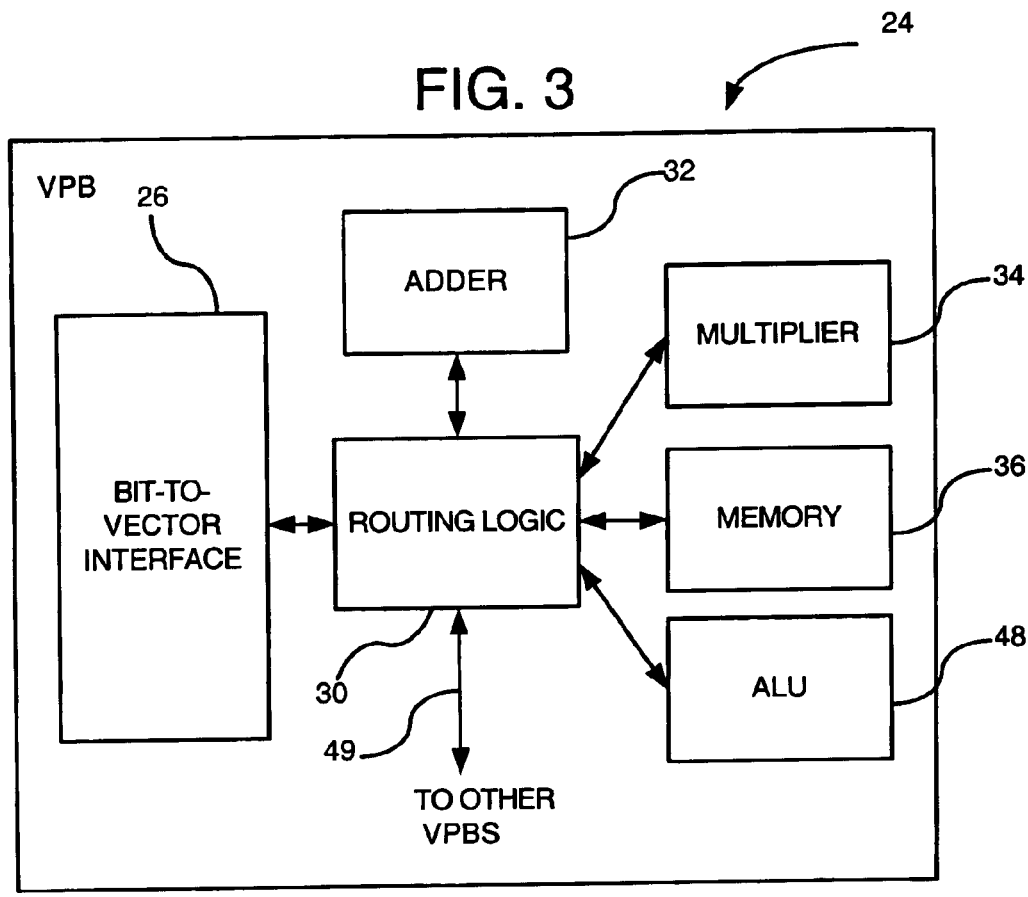

Routing Table

| src-dest | states | est.cost | req'd_tpd | inter#1-cost | inter#1-tpd | ... |
|---|---|---|---|---|---|---|
| 1. v0mu0-v4vm0b | 4-6 | 4.4 | 5.0ns | 4.4 | 4.6ns | |
| 2. v4vm0b-v5a10 | 7 | 1.5 | 5.0ns | 1.5 | 4.8ns | |
| 3. v2vm0b-v1ad1 | 1.3 | 1.5 | 4.5ns | 0.5 | 4.0ns | |

Path Table

| Path # | Cost | Path |
|---|---|---|
| 1 | 4.4 | v0mu0->v0xeo1->v0xvs1->col2->v4xce2->v4xmd1 |
| 2 | 4.4 | v0mu0->v0xeo2->v0xvs2->col4->v4xce2->v4xmd1 |
| ... | | |

METHOD OF ROUTING IN A PROGRAMMABLE LOGIC DEVICE

RELATED APPLICATION DATA

This application is a continuation-in-part of application Ser. No. 10/187,236, filed Jun. 28, 2002.

TECHNICAL FIELD

The present invention relates to programmable logic devices (PLDs) such as field programmable gate arrays (FPGAs) and CPLDs. More particularly, the present invention relates to a method for routing signals within a PLD.

BACKGROUND

Non-volatile memory devices, such as EPROM, EEPROM, and Flash EEPROM, store data even after power is turned off. One common application of EEPROMs is in programmable logic devices (PLDs). PLDs are standard semiconductor components purchased by systems manufacturers in a "blank" state that can be custom configured into a virtually unlimited number of specific logic functions. PLDs provide system designers with the ability to quickly create custom logic functions to provide product differentiation without sacrificing rapid time to market. PLDs may be reprogrammable, meaning that the logic configuration can be modified after the initial programming.

One type of PLD is known as a Field-Programmable Gate Array (FPGA). An FPGA is a general purpose device that can be programmed by an end user to perform one or more selected functions. An FPGA typically includes an array of individually programmable logic cells (PLCs), each of which is programmably interconnected to other PLCs and to input/output (I/O) pins via a programmable routing structure to provide the selected function. Examples of such devices are exemplified in U.S. Pat. Nos. 4,642,487; 4,706,216; and 4,758,985.

An FPGA device can be characterized as an integrated circuit that may include four major features:

(1) A user-accessible, configurable memory device, such as SRAM, EPROM, EEPROM, anti-fused, fused, or other, is provided in the FPGA device so as to be at least once-programmable by device users for defining user-provided configuration information. Static Random Access Memory or SRAM is a form of reprogrammable memory that may be differently programmed many times. Electrically Erasable programmable ROM or EEPROM is another example of nonvolatile reprogrammable memory. The configurable memory of an FPGA device may be formed of a mixture of different kinds of memory elements if desired (e.g., SRAM and EEPROM).

(2) Input/Output Blocks (IOBs) are provided for interconnecting other internal circuit components of the FPGA device with external circuitry. The IOBs may have fixed configurations or they may be configurable in accordance with user-provided configuration information.

(3) PLCs are provided for carrying out user-programmed logic functions (e.g., logic gates) as defined by user-provided configuration information. Typically, each of the many PLCs of an FPGA has at least one lookup table (LUT) that is user-configurable to define any desired truth table. A PLC may have other resources such as LUT input signal preprocessing resources and LUT output signal post-processing resources.

(4) An interconnect network is provided for carrying signal traffic within the FPGA device between various PLCs and/or between various IOBs and/or between various IOBs and PLCs. At least part of the interconnect network is typically configurable so as to allow for programmably-defined routing of signals between various PLCs and/or IOBs in accordance with user-defined routing information.

Most FPGAs have these four features, but modern FPGAs tend to be even more complex. For example, many PLCs can be configured together to implement such devices as multipliers or complex microprocessors. For example, U.S. Pat. No. 5,754,459, issued May 19, 1998 to Telikepalli, teaches implementing a multiplier circuit using a number of PLCs in an FPGA architecture. However, implementing a multiplier using PLCs of an FPGA architecture may not only consume valuable PLC resources, but also consume valuable general interconnect resources, which in turn may slow performance of the FPGA device. Consequently, preconfigured, dedicated multipliers have been inserted into some FPGA designs in order to free valuable PLC resources for other functions, such as illustrated in U.S. Pat. No. 6,362,650 to New, et al.

While such dedicated components have benefits, they also create difficulty in routing the interconnect network. Nonetheless, it is desirable to provide an FPGA device that can further free PLC resources while increasing overall functionality. The network should be configured to link the multiple components for connections that produce reasonable propagation delays, while still providing adequate resources for other connections.

SUMMARY

A method is disclosed to efficiently route in a PLD. Routing a signal in a PLD requires electrically linking multiple path elements to connect a source to a destination. The source and destination may be electrically connected during certain states, while during other states, the source and destination need not be connected. The different states allow for time-vision multiplexing of the path elements. Consequently, a method is disclosed for routing vector connections using connectivity information for the design; assigning priorities using an estimated cost for each connection; and considering one or more possible paths for each connection. Routing efficiency may be improved by using time-division multiplexing to route multiple connections through a PLD element.

These and other aspects will become apparent from the following detailed description, which makes reference to the accompanying drawings.

BRIEF DESCRIPTION OF DRAWINGS

FIG. 1 shows a high-level diagram of an interface within a PLD for converting bits from a PLD domain to vectors in a vector domain.

FIG. 2 is a block diagram showing a PLD having multiple vector domain components (VDCs) with multiple interfaces for communicating between vector and PLD domains.

FIG. 3 is a high-level block diagram of an exemplary VDC (in this case, a vector processing block (VPB)) of FIG. 2.

DETAILED DESCRIPTION

Figure 4:
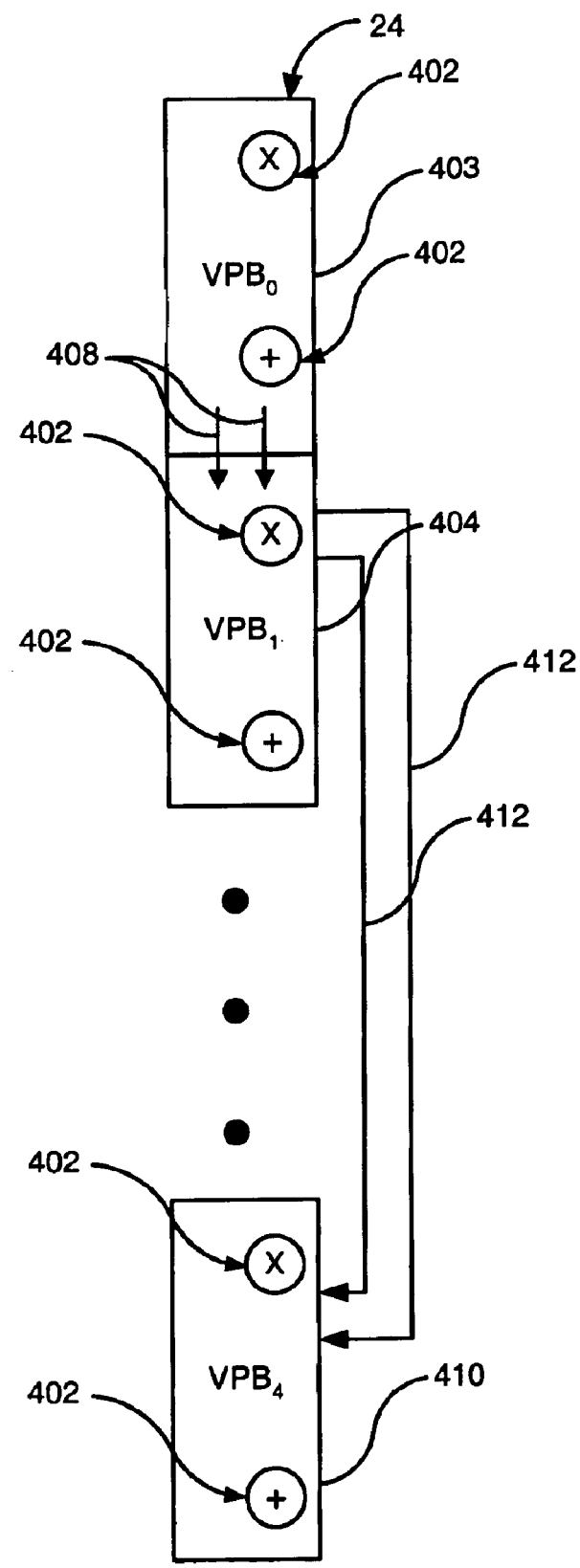
FIG. 4 is a high-level diagram of a column of VPBs showing methods of routing signals between VPBs.

FIG. 1 shows a high-level diagram of a programmable logic device (PLD) 10 in accordance with the invention including a PLD domain 12, a vector domain 14, and an interface 16 between the two domains 12 and 14. The PLD may be one of many types of programmable devices, such as a field programmable gate array (FPGA). The PLD domain may include conventional fine-grain logic, memory and routing resources where signals are switched and routed on a bit-by-bit basis. Such bit-by-bit manipulation is termed unordered because the bits are not arranged in a predetermined order throughout the domain. The vector domain 14 may include course-grain logic blocks (also referred to herein as vector domain components, or VDCs) that perform functions on digital words (integer operands), which comprise multiple bits grouped together (e.g., 16, 32, 64 bits, etc.) in a predetermined order throughout the domain. These words of ordered bits are referred to as vectors. In the vector domain 14, groups of wires are routed together as a vector signal path so that all bits in a digital word are manipulated as a vector. That is, the bits in a vector are controlled and switched at once as a group. The interface 16 converts selected unordered bits from the PLD domain 12 to vectors for the vector domain. The interface 16 may also perform other functions, such as the formatting functions of scaling and sign extension, to further remove any routing burdens on the PLD domain.

The vector domain components are components that operate on data in a vector-wide manner, such as a 32-bit adder, a 16-bit multiplier, a vector processing block (VPB), etc. Using vector switch boxes to switch a vector, ordered bits from one vector-based component are routed to another vector-based component with a substantially reduced set of control lines, while the bit order is maintained for the bits that make up the vector. For example, a single control line may be used to switch an entire vector of 8 bits. The ordering of the bits is also maintained in the example 8-bit vector with bit 0–7 being in the same order.

FIG. 2 shows a block diagram of the PLD 10 in greater detail. The PLD is housed in an outer package 18, which includes input and output pins (not shown). The PLD has multiple columns of programmable logic cells (PLC), as shown generally at 20. The number of columns of PLCs varies based on the design. As shown at 22, additional PLCs and/or other logic may also exist within the PLD. For example, other devices (e.g., memories, multipliers, etc.) may be included in logic 22. The illustrated PLD 10 includes one or more columns of VDCs. In this case, the VDCs comprise vector processing blocks, or VPBs, shown generally at 24. Within each VPB is an interface 26 (a particular implementation of interface 16) to facilitate communication with the adjacent PLCs. In the illustrated design there is one interface per VPB, although additional interfaces may be included. Alternatively, the interface 26 may be located externally to VPB 24.

FIG. 3 shows a more detailed diagram of a VPB 24. Routing logic 30 is coupled to the interface 26 and facilitates routing to various components (i.e., engines) within the VPB. More generally, engines and other parts used in routing signals are referred to as "elements" or "routing elements." Elements include a diverse range of parts, such as multipliers, multiplexers, adders, wire segments, tri-state buffers, and ALUs. Routing between engines within the VPB is called "local routing" and is the most basic of three types of routing. The two additional forms of routing are called adjacent routing and global routing and are described below. Elements in the VPB may include one or more of the following engines: adders (e.g., adder 32), multipliers (e.g., multiplier 34), memory (e.g., memory 36) and ALUs (e.g., ALU 48). As shown at 49, the VPB 24 may be connected via the routing logic 30 to engines within other VPBs or within other VDCs in the PLD 10. Thus, the vectors can be routed between VPBs. Other features of the VPB are not shown but may be readily included, such as VPB engines (i.e., specialized pipelined datapath units that perform functions with vector data, which would be especially expensive or difficult to accomplish with PLD cells). It is desirable for the VPB to not be a general-purpose processor. In the illustrated embodiment, for instance, it is an application-specific embedded processor that requires a relatively small program store and communicates only with dedicated internal resources. The embedded processor is not built from combinations of programmable logic blocks. Instead, it is made from logic that is designed for a particular type of function (e.g., multiply, add, etc.). By contrast, general processors require large program stores and flexible interfaces to support a wide range of peripheral devices, such as keyboards, disk drives, printers and scanners.

FIG. 4 depicts a column of VPBs, where each VPB contains one or more engines, shown generally at 402. $VPB_0$ 403 and $VPB_1$ 404 are adjacent to each other in the column and may utilize the second of three forms of vector routing: adjacent routing. Adjacent routing involves sending vector signals 408 between VPBs that are directly adjacent to each another. Global routing, the third form of vector routing, may be used to route vector signals between non-adjacent VPBs. For example, vector signals from $VPB_1$ 404 can be routed to non-adjacent $VPB_4$ 410 by sending the vector signals over the global route 412, which runs to all VPBs in the column. Other global routes may also be available. All three levels of routing involve a physical path that may travel through various types of elements, including engines, wires, and switches.

Figure 5:
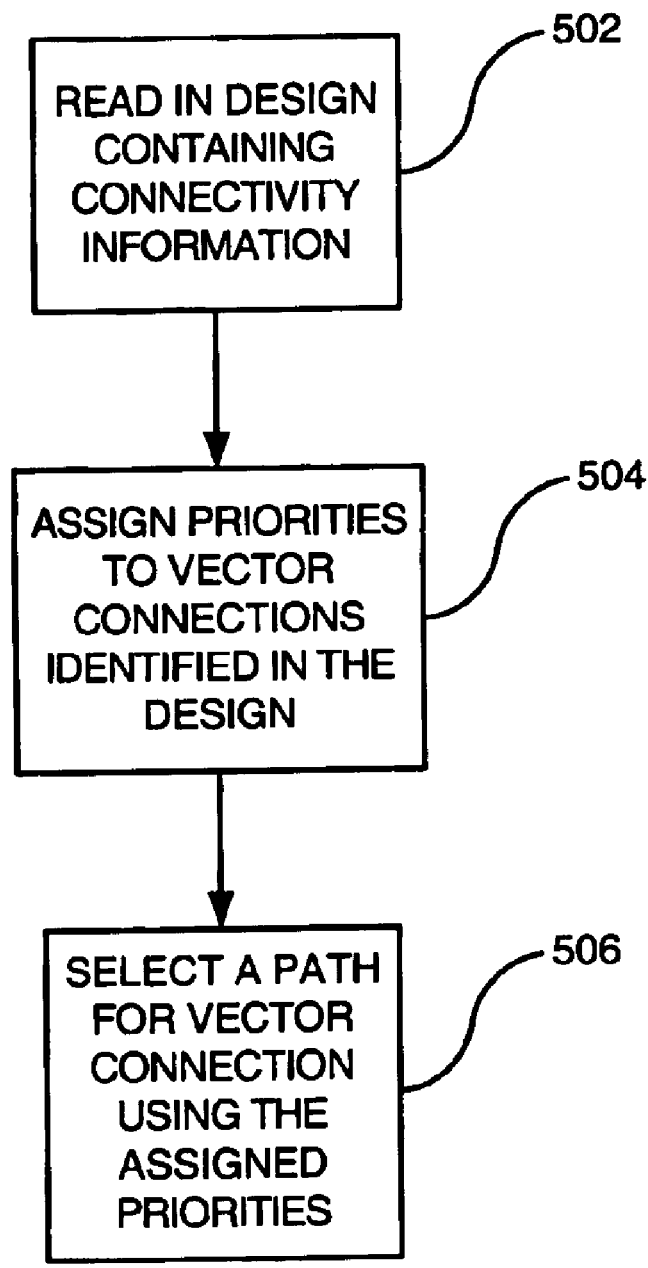
FIG. 5 is a flowchart showing a method for configuring vector connections in a PLD.

FIG. 5 is a flowchart depicting a method for configuring a PLD in accordance with the invention. Although a VPB is described in this embodiment, other VDCs may also be used. Process block 502 reads in a circuit design containing connectivity information. Connectivity information may be contained in an architectural description file, such as an RTL or HDL file, and may include, among other things, the following: architecture information of the PLD; the types of elements available in the PLD; cost parameters assigned to routing elements in the PLD; and a netlist including source and destination pairs in the design. The architecture information may include the number of static routing paths, dynamic routing paths, the number of static column driver modes, the total number of VPBs, the number of VPBs per column, tri-state column segments, etc. Static routing paths are groups of wires used to carry a vector which are programmed prior to circuit operation and cannot be altered during operation. These paths may be made up of smaller segments. A dynamic routing path, on the other hand, may be modified during circuit operation. Static column driver modes are possible ways for repeaters to be configured to drive different sources in the PLD. A tri-state column segment allows a signal path to be dynamically reconfigured during operation so that multiple source and destination pairs may share the same path during operation.

The cost parameter assigned to an element influences how routing resources are allocated. An element with a higher cost parameter is less likely to be used in routing a signal than an element with a lower cost parameter. If using an element to route a signal significantly limits routing possibilities for other signals, then it is desirable that the element be used only if no other less restricting element is available. A high parameter cost is used to associate this undesirability with the element. For example, a multiplier may have three ways to access a memory port, while an adder may have only one. Accordingly, the adder would have a higher cost than the multiplier, since routing a signal between the adder and the memory prevents other signals from being routed between the adder and the memory. A higher cost parameter allows such restrictions to be accounted for when routing signals. Also by way of example, an input coming from a multiplexer may have fewer routing options than an ALU, and therefore the multiplexer input would have a higher cost. A set of cost parameters could be as follows: cost of static routing path segment=1; cost of tri-state column segment= 1.2; cost of dedicated route=0.2; cost of adjacent VPB route=0.5. A dedicated route is a connection that does not change in time. Alternatively, instead of reading in a set of cost parameters, the method could use a default set.

The netlist includes data about required connections between source and destination pairs for a set of states (hereinafter referred to as a "connection" or "vector connection"). For example, the information for a particular connection may include a source (e.g., a multiplier) in a first VPB, and a destination in a second VPB. A desired set of states or time slices for which the connection is to be made may also be included in the netlist. State information allows for time-varying connections. In one possible implementation, a netlist could be comprised of a set of switch statements, with each case in the switch statement corresponding to a different state or set of states. For example, a switch statement could route the output of a source $mux_1$ to a destination $alu_3$ for state 1, while for states 2 and 3, the output of $multiplier_2$ may be routed to $adder_2$. Thus, a list of states can be identified during which a source and destination are to be electrically connected. In another possible implementation, an element could be configured statically (i.e., the same for all states). The netlist may also provide information concerning the required propagation delay for a certain connection.

In process block 504, priorities are assigned to vector connections identified in the circuit design. Further details of assigning priorities are described in relation to FIG. 6. In process block 506, a path is selected for each vector connection using the assigned priorities. In this context, a "path" is the physical track, made up of elements, along which a signal travels from its source to its destination. The selected path may be valid for only one or more states, and during other states the path may be used to connect other vector components. Thus, paths may be time-varying.

Figure 6:
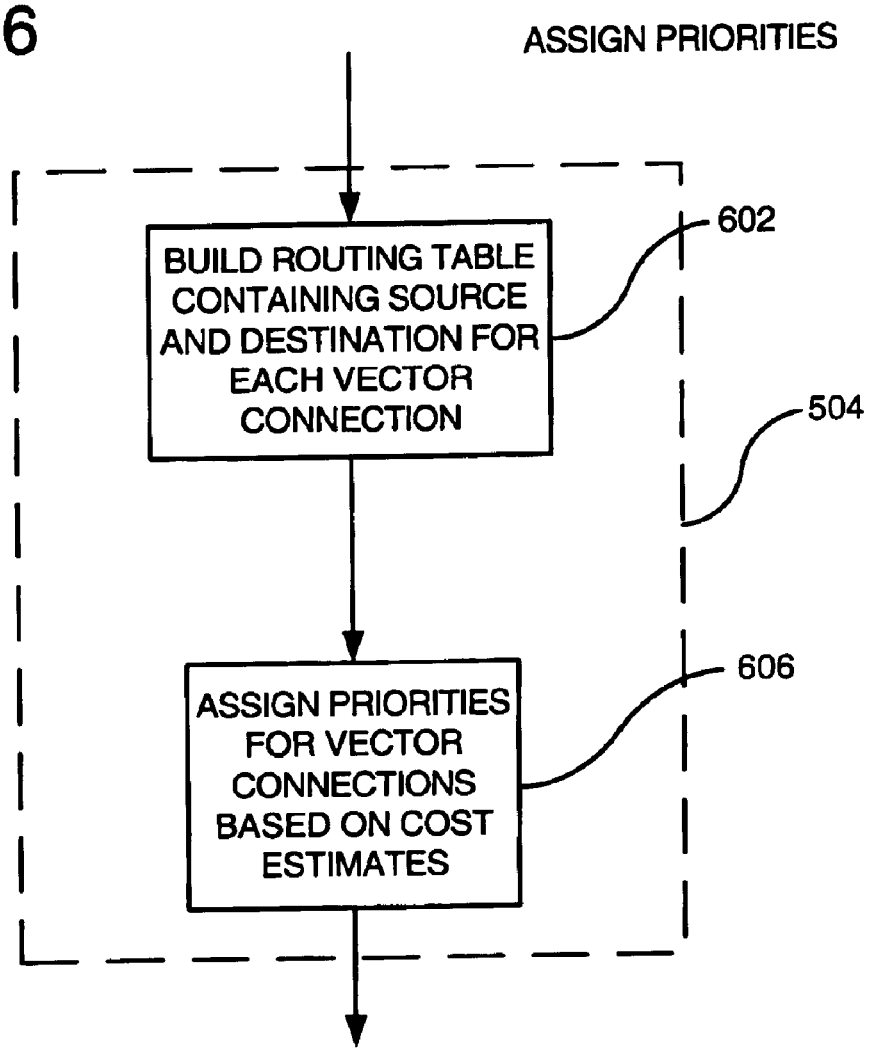
FIG. 6 is a flowchart showing the assigning of priorities for vector connections.

FIG. 6 describes the process of assigning priorities to vector connections in more detail (process block 504 in FIG. 5). In process block 602, a routing table or other suitable data structure containing information such as the source and destination for each vector connection is assembled. Cost estimates for each connection are also assigned and stored in the table. In this context, "cost estimate" refers to the degree to which executing a given vector connection affects the availability of elements for other vector connections. Cost estimates are produced using factors such as: the cost parameters from the architecture information; the types of source and destination elements used; and the states during which those elements are used. (Any elements that might be used for the path between the source and destination are usually not relevant for this estimate, unlike the cost for the path, described below.) The physical distance from the source to the destination is also considered, with connections between sources and destinations within the same VPB having the lowest cost, and connections between sources and destinations in non-adjacent VPBs having the highest cost. In process block 606, priorities for vector routes are assigned based on the cost estimates. In one embodiment, the vector connection with the highest cost estimate is assigned the highest priority, and the remaining vector connections are assigned priorities in descending order of cost estimate.

Figure 7:
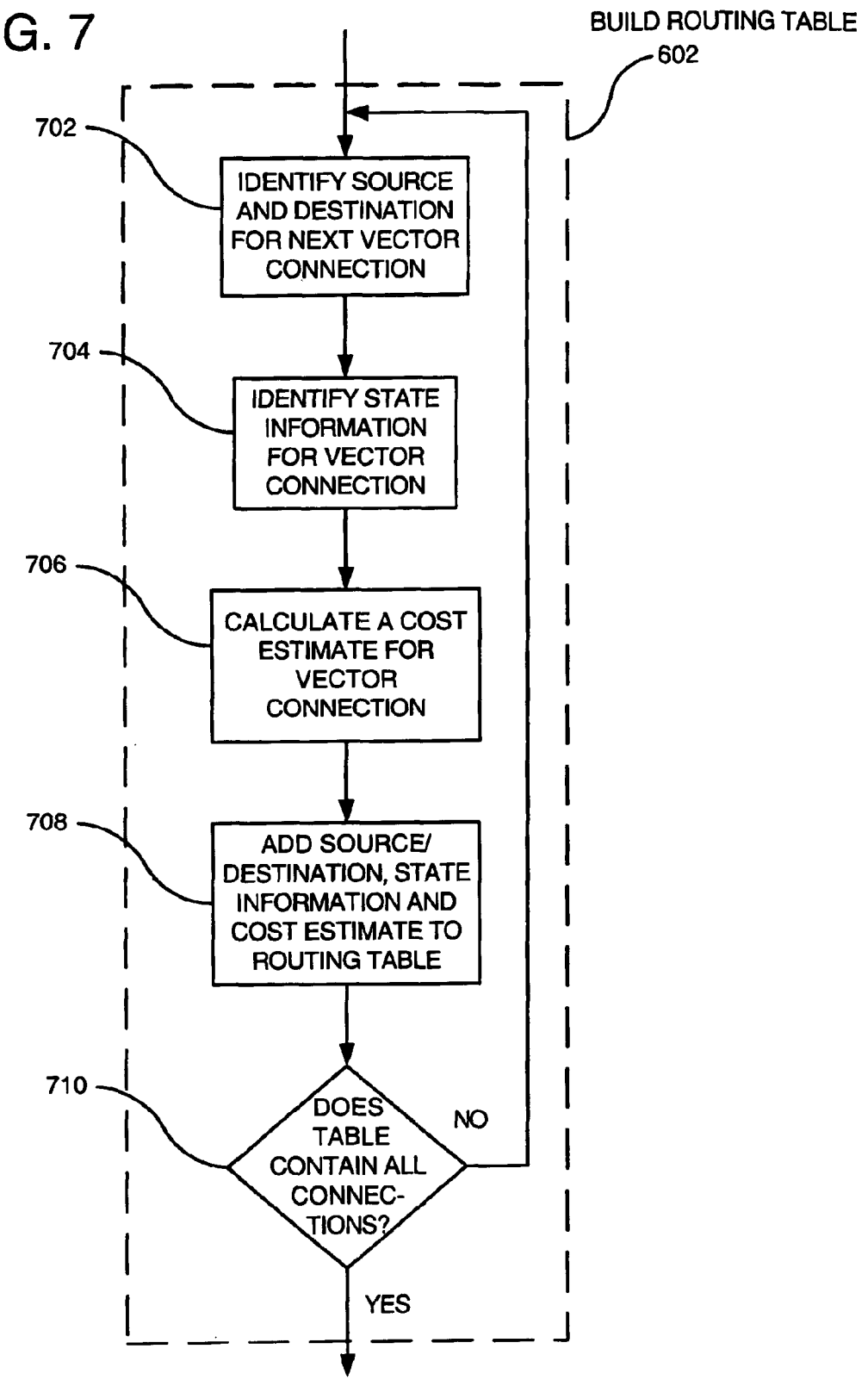
FIG. 7 is a flowchart showing the building of a routing table for vector connections.

FIG. 7 describes the process of building a routing table (process block 602 in FIG. 6) in greater detail. In process block 702, the source and destination pair for a vector connection is identified. In process block 704, the state information for the vector connection is identified. The state information relates to the time slices of a state machine during which the source and destination associated with the vector connection communicate. In process block 706, a cost estimate for the vector connection is calculated using the factors mentioned above. In process block 708, the source and destination, the state information, and the cost estimate are added to the routing table. In process block 710, this process is repeated until information for each connection exists in the routing table.

Figure 12:
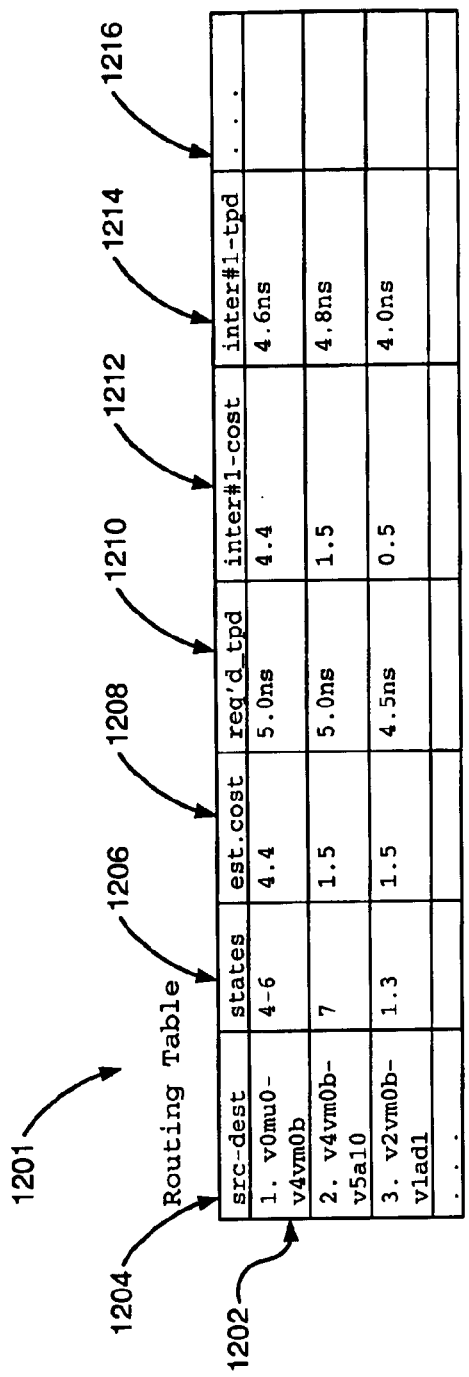
FIG. 12 shows an exemplary routing table.

Turning briefly to FIG. 12, a portion of an example routing table 1201 is shown. It is desirable that an entry row exists for each connection, as shown generally at 1202. For each connection, the table records a source and destination pair, shown generally in column 1204; the states for which the connection is active, shown generally in column 1206; the estimated cost of the connection, shown generally in column 1208; and the required propagation delay, shown generally in column 1210. The required propagation delay may be included in the connectivity information. Finally, associated costs for multiple possible paths may optionally be stored in the routing table as shown at 1212, 1214, and 1216. As described below, these values may be stored in a different table.

Figure 8:
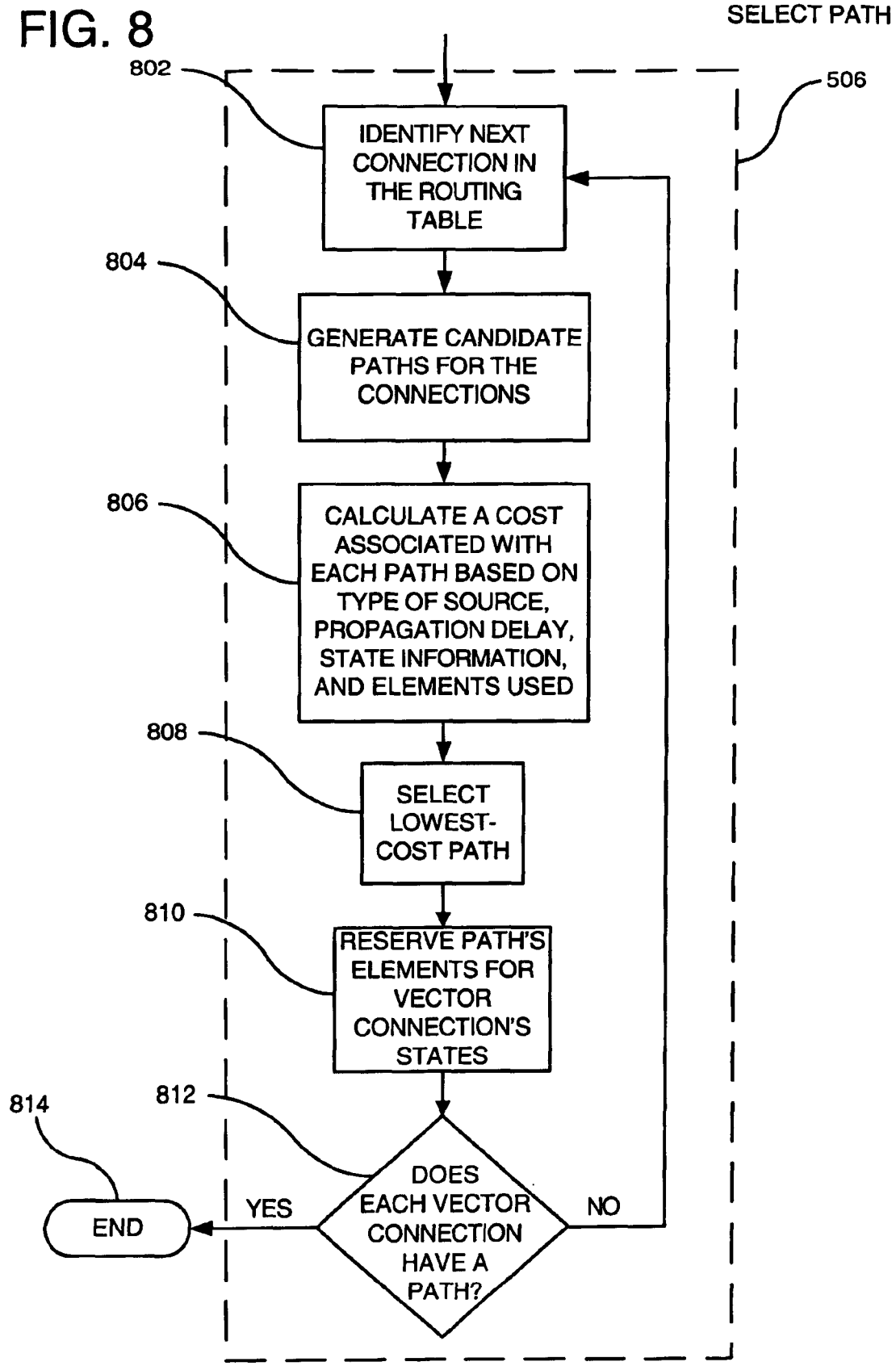
FIG. 8 is a flowchart showing the selecting of a path for a vector connection.

FIG. 8 describes the selection of paths for the vector connections (process block 506 of FIG. 5) in more detail. In process block 802, a connection is read from the routing table based on its assigned priority. In process block 804, one or more possible candidate paths are determined for the selected connection. That is, several physical paths are generated through which the signal specified in the design could travel during that signal's required states. The possible paths generated do not use any elements that are already in use by another connection during the required states. However, a possible path may reuse one or more elements already occupied by another vector connection during a different state or time slice. Thus, by using state information, path elements may be reused by time-division multiplexing. In process block 806, a cost is calculated for each possible path, and the paths and their associated costs are placed in a path table. In this context, the cost corresponds to the type and number of elements that the path uses and therefore renders unavailable to possible paths for other connections. The general technique for calculating the cost of a path is similar to that used for estimating the cost of a connection in process block 706 of FIG. 7. Factors considered include the types and number of elements used and the states during which those elements are used, as well as the availability and cost of the intervening elements (and not merely the source and destination elements). For instance, a path that uses many elements for a higher number of states generally has a higher cost than a path that uses a smaller number of elements for the same number or a smaller number of states. Additionally, a timing information table, which contains timing delay information for various elements, may be used to calculate the cost function.

Figure 13:
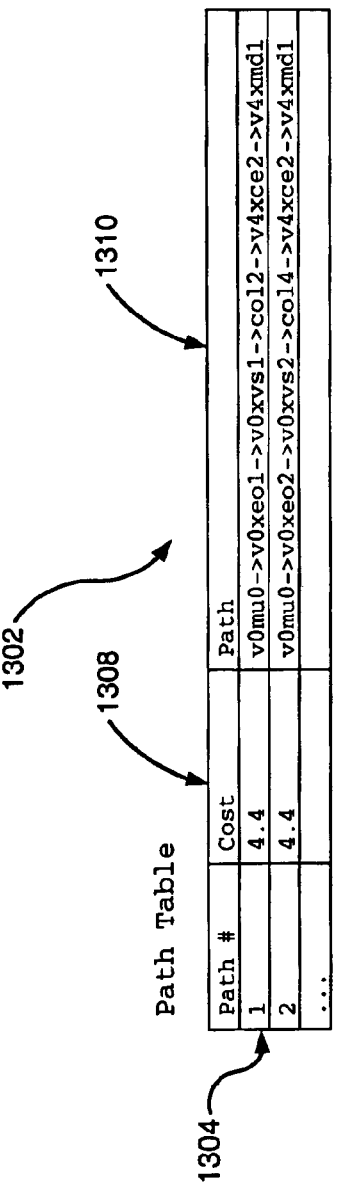
FIG. 13 shows an exemplary path table.

Turning briefly to FIG. 13, a sample path table 1302 is depicted. For each possible path shown generally at 1304, a calculated cost, shown generally in column 1308, and a path, shown generally in column 1310, are recorded. Note that both paths 1 and 2 in the sample table have the same source (v0mu0) and destination (v4xmd1), but they traverse different intervening elements, as indicated by the differing intermediate steps in each possible path. A propagation delay for the path (not shown) may also be recorded in the table.

Returning to FIG. 8, in process block 808, the lowest-cost possible path is selected based on the cost calculated in process block 806. Alternatively, the fastest path maybe selected. In process block 810, the elements used in the selected path are reserved for the vector connection's states, meaning that the elements are made unavailable for possible paths that could-be used for other connections. In process block 812, this process is repeated until every connection in the routing table has a corresponding path. In one embodiment, the cost and timing delay of the selected path for each connection can be stored in the routing table 1201, as shown generally in FIG. 12 at 1212 and 1214. In process block 814 of FIG. 8, the method is terminated.

Figure 9:
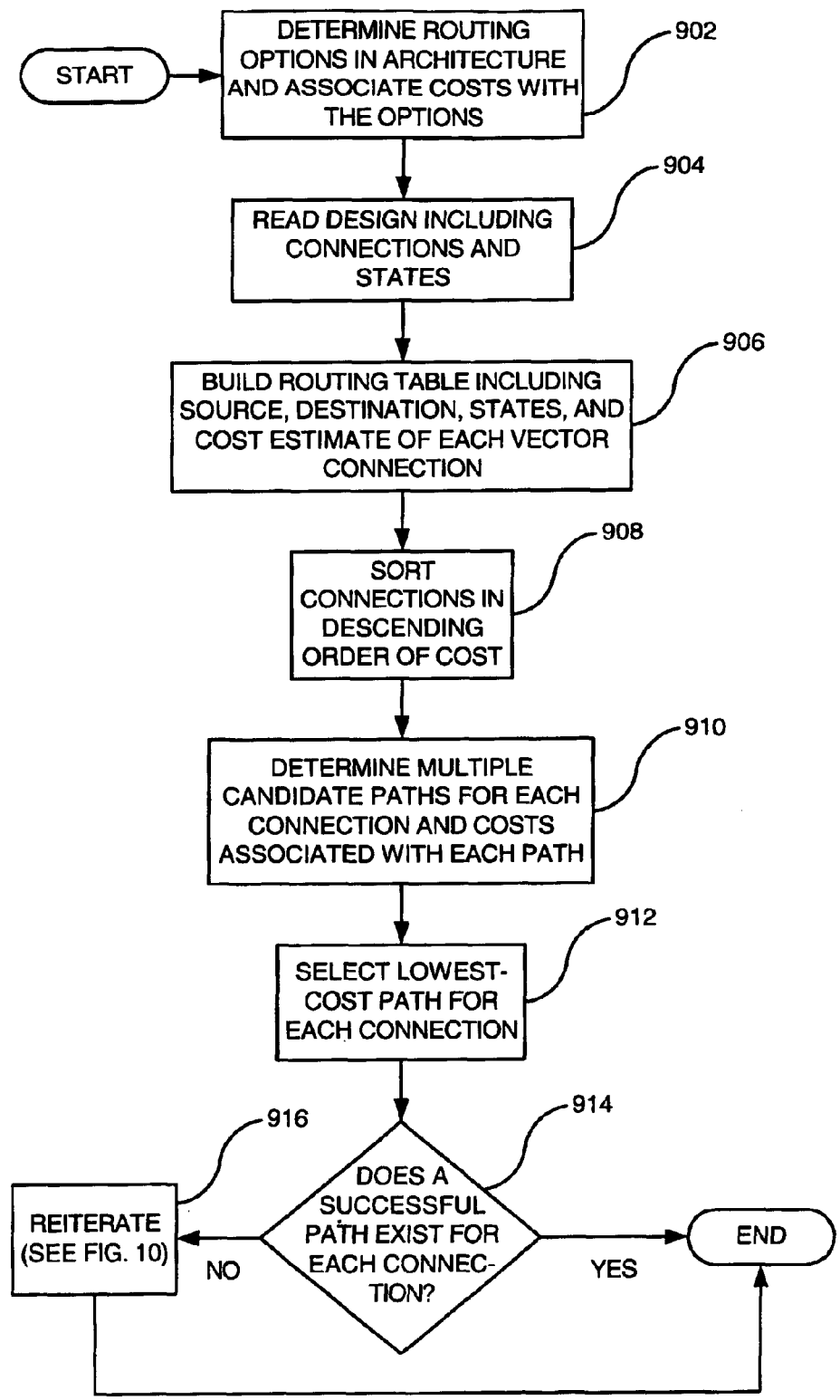
FIG. 9 is a flowchart showing a method for configuring time-varying vector connections in a PLD, including iterative processes.

FIG. 9 summarizes the entire process in one flowchart. In process block 902, the routing options in the available architecture are determined and the costs are associated with the options. In process block 904, design information detailing the connections and the states is read. In process block 906, the routing table is built. In process block 908, the connections are sorted in descending order of cost. In process block 910, multiple candidate paths and their respective costs are determined for each connection. In process block 912, the lowest-cost path for each connection is selected. It is possible that some connections may not have a successful path at this point. That is, for a given state or states, there may be no possible path that can achieve the desired connection. This occurs when one or more necessary elements are already in use by paths for other connections during the given state or states. In process block 914, if each connection has a successful path, the process terminates. If one or more connections have no successful path, sometimes a successful path can be found using one or more iterative processes, as shown in process block 916.

Figure 10:
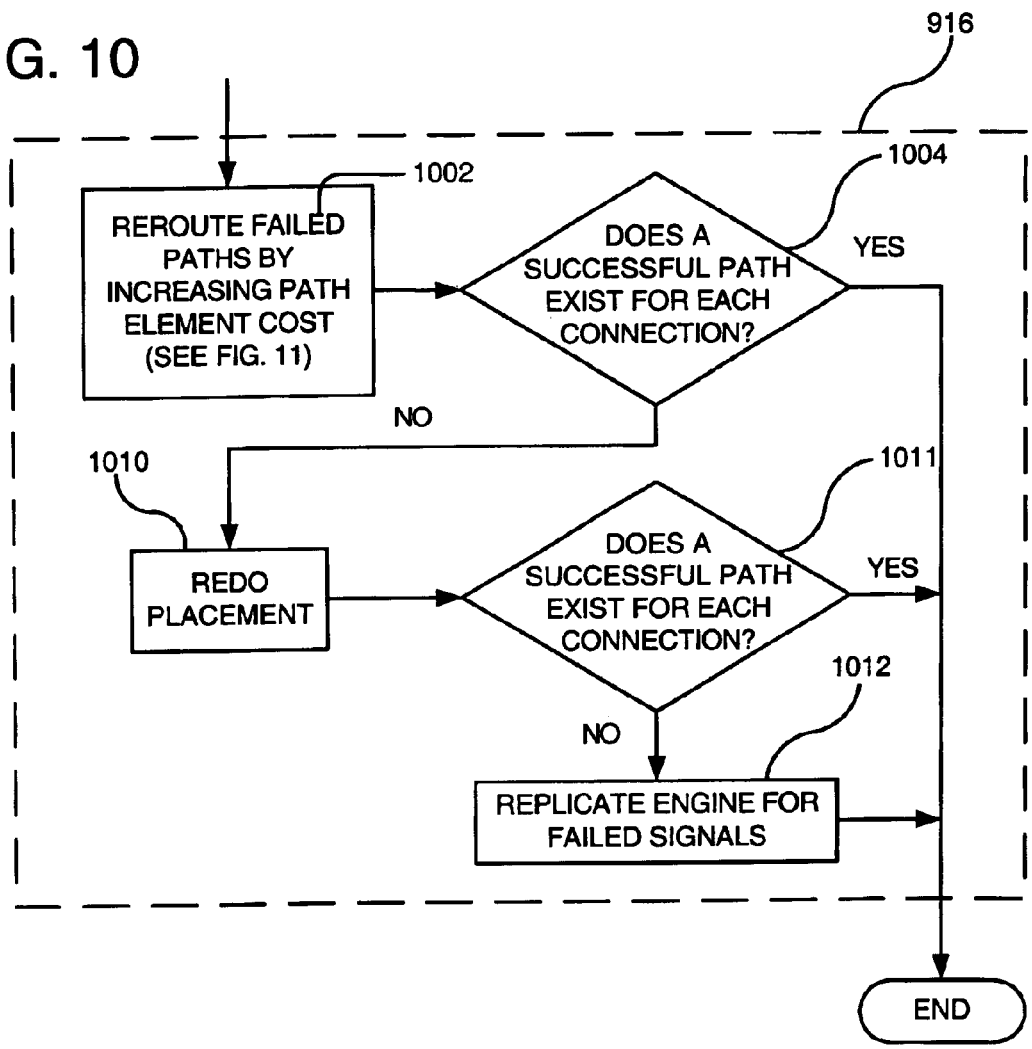
FIG. 10 is a flowchart showing the selecting of a path using iterative processes.

FIG. 10 exemplifies one possible set of iterative processes. As some processes are more likely than others to produce a successful path with a high cost, the order in which the processes are executed can be significant. For example, in this particular embodiment, the process that precludes the fewest possible paths for other connections is executed first. This is the process of rerouting failed paths by adjusting path element cost, shown in process block 1002. Other processes generally have progressively higher costs and are therefore executed later. For example, process block 1010 depicts the process of redoing placement, which is performed only if it is determined at process block 1004 that, for one or more connections, the process of rerouting failed paths by adjusting path element cost failed. Similarly, the process of engine replication is performed only if it is determined at process block 1011 that the process of redoing placement failed. After the final process, the algorithm terminates. In one embodiment, information such as the cost and timing delay of the new path chosen for a connection after an iteration can be stored in the routing table, as shown generally in FIG. 12 at 1216. It will be obvious to one skilled in the art that a number of other processes could be substituted for or used in conjunction with those listed above.

Figure 11:
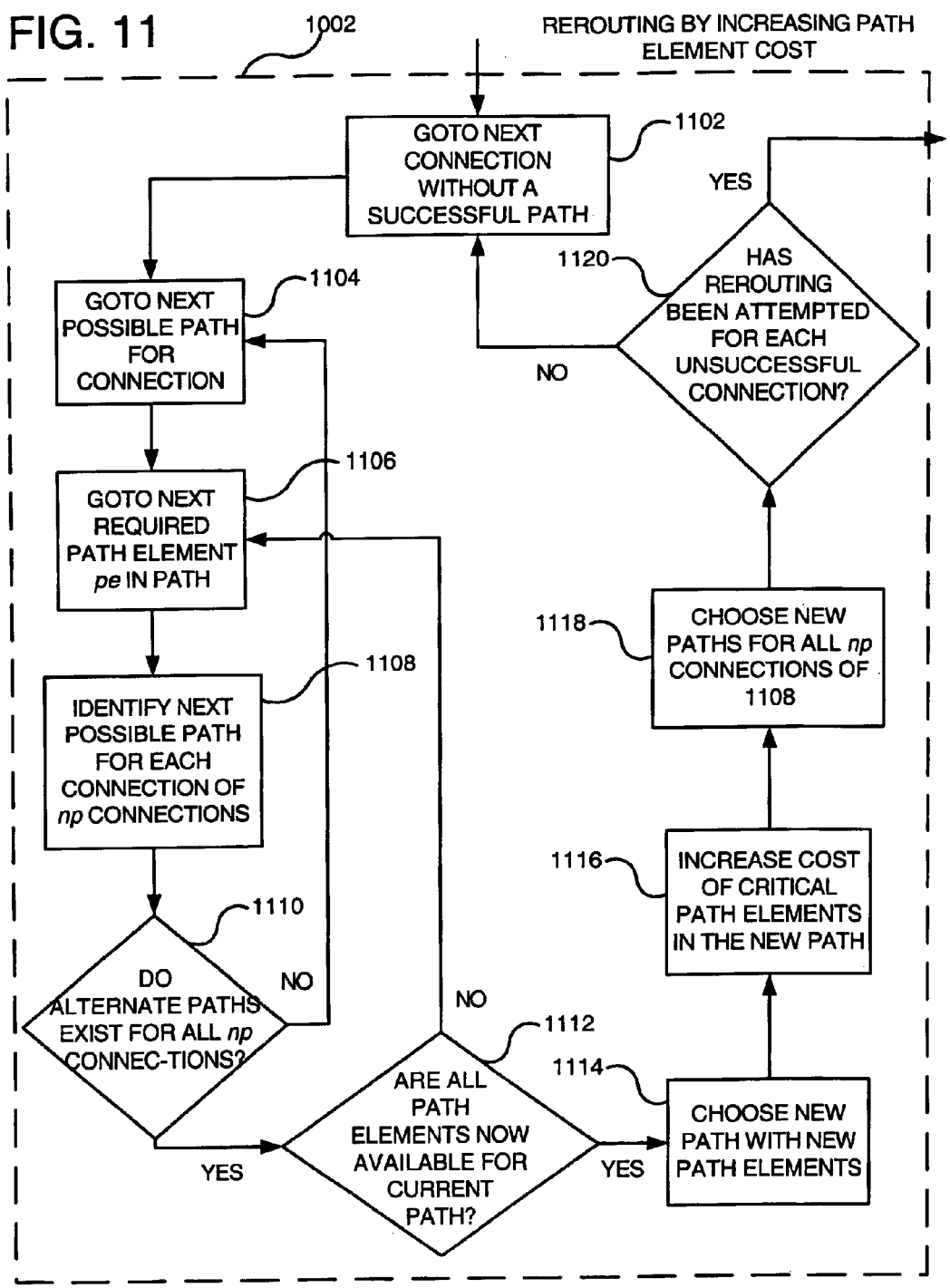
FIG. 11 is a flowchart showing the iterative process of rerouting connections by adjusting path element cost.

FIG. 11 details the process of rerouting by adjusting path element cost, process block 1002 in FIG. 10. In process block 1102, a loop is set up to examine each connection that does not have a successful path. In process block 1104, a loop is set up to examine each possible path in the path table of a connection, as depicted in FIG. 13. In process block 1106, a loop is set up to examine each required path element (e) in a path. In process block 1108, an alternate path is sought for each of the connections that use path element pe during the required states (the "np connections"). This may be one or more connections, depending on how many states are required. Specifically, a path is sought that does not use pe. In process block 1110, once alternate paths are determined, the path element pe is examined to determine if it can be made available or "freed" from all np connections. That is, the process determines if alternate paths, which do not use pe during the required states, can be found for all np connections. If pe cannot be made available for the unsuccessful connection, the process examines the next possible path for the unsuccessful connection in process block 1104. In process block 1112, if pe can be made available, this process is repeated as long as it is possible that an additional element in the path can be made available. In process block 1114, once all elements are available for the current path, a new path with elements that have been made available is chosen for the connection. In process block 1116 the costs of all path elements in the new path may be increased. Adjusting path element cost raises, for example, the cost of paths that use these elements, thus decreasing the probability that such paths are chosen for other connections. In process block 1118, new paths that do not use any of the required path elements are chosen for all np connections. In process block 1120, this iterative process terminates once rerouting has been attempted for each unsuccessful connection.

Figure 14:
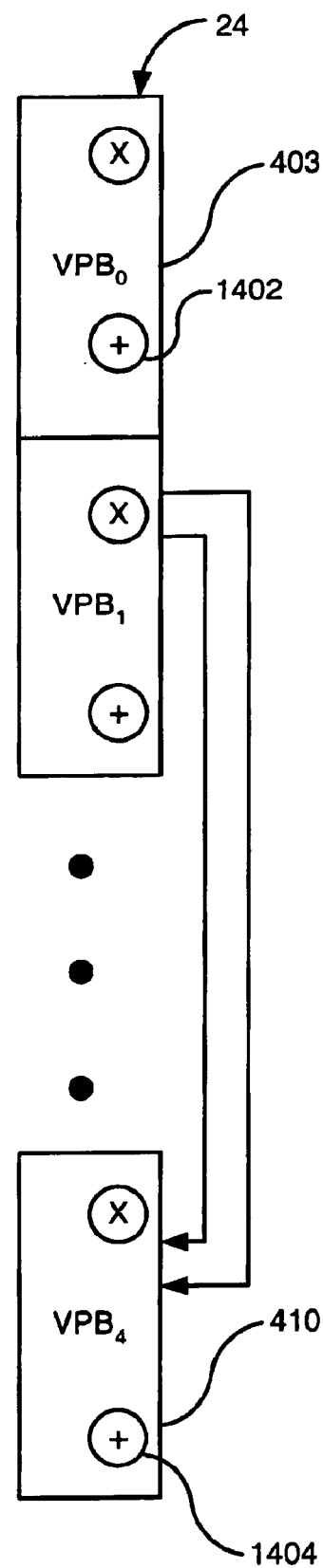
FIG. 14 is a high-level diagram of a column of VPBs where an engine has been replicated.

The remaining iterations that appear in FIG. 10 function briefly as follows. Redoing placement, shown in process block 1010, involves changing the placement of engines such that fewer bottlenecks in routing exist. Replicating engines for failed signals, shown in process block 1012 involves regenerating the source for a signal that cannot otherwise be routed. For example, as shown in FIG. 14, if a successful route cannot be found for a signal from adder 1402 in $VPB_0$ 403 to an engine in $VPB_4$ 410, then adder 1402 can be replicated as adder 1404 in $VPB_4$ 410. This means that adder 1404 provides the same outputs as adder 1402 would provide under identical circumstances.

The output of the invention may be a set of configuration patterns and hardware description language (HDL) code that can be used to program the PLD. The HDL code should describe the logic required to control all dynamic routing elements, which may include state machines and state machine decode logic. Further, the HDL code should be in a format that can be readily consumed by standard synthesis tools, so that a structural netlist of FPGA building blocks (lookup tables and registers) can be created by the synthesis tool.

The invention may also be applied to volatile memory devices.

Having illustrated and described the principles of the illustrated embodiments, it will be apparent to those skilled in the art that the embodiments can be modified in arrangement and detail without departing from such principles. For example, signals other than vectors can be dynamically routed. In view of the many possible embodiments, it will be recognized that the illustrated embodiments include only examples and should not be taken as a limitation on the scope of the invention. Rather, the invention is defined by the following claims. I therefore claim as the invention all such embodiments that come within the scope of these claims.

I claim:

1. A method of routing a programmable logic device, comprising:

reading a design containing connectivity information;

assigning priorities to vector connections identified in the design based on the connectivity information;

selecting a path for a vector connection using the assigned priorities; and searching for alternate paths using one or more iterative processes, wherein the iterative processes including choosing an alternate path and adjusting a cost of one or more elements used in the path, wherein the choosing an alternate path comprises:

identifying one or more possible paths for an unsuccessful vector connection;

identifying path elements in one of the identified possible paths:

determining whether the path elements can be made available to a vector connection by searching for alternate paths for other vector connections that use the path elements; end performing the following if the path elements can be made available:

selecting the possible path containing the available path elements;

adjusting the cost of all path elements in the selected path; and selecting the alternate paths for the other vector connections that are using the required path elements.

2. The method of claim 1, wherein the steps of claim 1 are stored as instructions on a computer-readable medium.

3. A method of configuring time-varying connections in a programmable logic device, comprising:

reading a design containing connectivity and timing information;

assigning priorities to the time-varying connections identified in the design based on the connectivity and timing information; and selecting a path for a time-varying connection using the assigned priorities, wherein the assigning priorities comprises:

building a routing table containing the connectivity information, the connectivity information comprising source, destination, timing and cost estimate information for time-varying connections; and using the cost estimate information to assign priorities.

4. The method of claim 3, wherein the timing information includes state information.

5. The method of claim 3, wherein the connections are vector connections.

6. The method of claim 3, wherein the building a routing table comprises:

identifying source and destination information for a time-varying connection;

identifying state information for the time-varying connection;

calculating a cost estimate for the time-varying connection; and including source, destination, and cost estimate information in the routing table.

7. The method of claim 3, further comprising iteratively searching for alternate paths using one or more iterative processes.

8. The method of claim 3, wherein the steps of claim 3 are stored as instructions on a computer-readable medium.

9. A method of configuring time-varying connections in a programmable logic device, comprising:

reading a design containing connectivity and timing information;

assigning priorities to time-varying connections identified in the design based on the connectivity and timing information; and selecting a path for a time-varying connection using the assigned priorities;

wherein the selecting a path for a time-varying connection comprises:

generating one or more possible paths for a time-varying connection;

calculating an actual cost associated with a possible path;

selecting the path with the lowest actual cost; and reserving the selected paths elements for the time-varying connection's states.

10. The method of claim 9, wherein the timing information includes state information.

11. The method of claim 9, wherein the connections are vector connections.

12. The method of claim 9, further comprising iteratively searching for alternate paths using one or more iterative processes.

13. The method of claim 9, wherein the steps of claim 9 are stored as instructions on a computer-readable medium.

* * * * *

UNITED STATES PATENT AND TRADEMARK OFFICE
CERTIFICATE OF CORRECTION

PATENT NO. : 6,907,592 B1
DATED : June 14, 2005
INVENTOR(S) : Conrad Dante

It is certified that error appears in the above-identified patent and that said Letters Patent is hereby corrected as shown below:

Column 9,
Line 43, "end" should be -- and --.

Column 10,
Line 14, "wherein the building" should be -- wherein building --.
Line 48, "selected paths elements" should be -- selected path's elements --.

Signed and Sealed this

Twenty-seventh Day of September, 2005

JON W. DUDAS
*Director of the United States Patent and Trademark Office*